United States Patent
Okuhira et al.

(10) Patent No.: US 10,717,867 B2
(45) Date of Patent: Jul. 21, 2020

(54) CURABLE POLYURETHANE TYPE RESIN COMPOSITION AND ELECTRICAL DEVICE USING THE SAME

(71) Applicant: DENSO CORPORATION, Kariya, Aichi-pref. (JP)

(72) Inventors: Hiroyuki Okuhira, Kariya (JP); Masakazu Atsumi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 16/096,435

(22) PCT Filed: Apr. 17, 2017

(86) PCT No.: PCT/JP2017/015505
§ 371 (c)(1),
(2) Date: Oct. 25, 2018

(87) PCT Pub. No.: WO2017/188050
PCT Pub. Date: Nov. 2, 2017

(65) Prior Publication Data
US 2019/0144668 A1    May 16, 2019

(30) Foreign Application Priority Data
Apr. 26, 2016    (JP) ................. 2016-088314

(51) Int. Cl.
| C08L 75/04 | (2006.01) |
| C08G 59/40 | (2006.01) |
| C08G 18/06 | (2006.01) |
| C08G 18/00 | (2006.01) |
| C08L 33/14 | (2006.01) |
| C08L 63/00 | (2006.01) |

(52) U.S. Cl.
CPC ............. *C08L 75/04* (2013.01); *C08G 18/00* (2013.01); *C08G 18/06* (2013.01); *C08G 59/40* (2013.01); *C08L 33/14* (2013.01); *C08L 63/00* (2013.01); *C08L 2203/20* (2013.01); *C08L 2205/03* (2013.01)

(58) Field of Classification Search
CPC .......... C08L 75/04; C08L 75/06; C08L 75/14; C08L 33/14; C08L 33/068; C09D 175/04; C09D 175/06; C09D 175/14
See application file for complete search history.

(56) References Cited

U.S. PATENT DOCUMENTS

| 5,026,793 A | * | 6/1991 | Nakai | C07F 7/0836 525/476 |
| 5,698,623 A | * | 12/1997 | Jacobs | C08G 18/324 252/514 |
| 2002/0120035 A1 | * | 8/2002 | Sawada | C08G 18/0814 523/410 |
| 2006/0189736 A1 | * | 8/2006 | Mori | C08L 101/10 524/404 |
| 2010/0210757 A1 | | 8/2010 | Sommer et al. | |
| 2012/0004371 A1 | * | 1/2012 | Watanabe | C08G 18/10 525/128 |
| 2013/0041072 A1 | | 2/2013 | Sommer et al. | |
| 2013/0131222 A1 | * | 5/2013 | Gross | C08G 18/4288 524/35 |
| 2015/0077947 A1 | * | 3/2015 | Jordan, Jr. | C08G 18/8067 361/748 |
| 2015/0299476 A1 | * | 10/2015 | Liu | C09D 5/24 359/892 |
| 2016/0168412 A1 | | 6/2016 | Caillouette et al. | |

FOREIGN PATENT DOCUMENTS

| JP | H07224000 A | 8/1995 | |
| JP | 2010202869 A | 9/2010 | |
| JP | 2012001603 A | 1/2012 | |
| JP | 2013521357 A | 6/2013 | |
| WO | WO-2009120211 A1 * | 10/2009 | ............. C08L 67/02 |
| WO | WO-2015013064 A1 | 1/2015 | |

\* cited by examiner

*Primary Examiner* — Michael M Dollinger
(74) *Attorney, Agent, or Firm* — Harness, Dickey & Pierce, P.L.C.

(57) ABSTRACT

A curable polyurethane type resin composition which is applicable for a sealing material for an electrical device used in a vehicle, enhances a hydrolysis resistance of a cured substance and can suppress a decrease in physical properties in high temperature and high moisture environments. The curable polyurethane type resin composition contains castor oil-type polyol, polyisocyanate, and epoxidized acrylic polymer. The electrical device has electrical components covered with a sealing material consisting of a cured substance of the curable polyurethane-type resin composition.

11 Claims, 1 Drawing Sheet

CURABLE POLYURETHANE TYPE RESIN COMPOSITION AND ELECTRICAL DEVICE USING THE SAME

CROSS REFERENCE TO RELATED APPLICATIONS

This application is a U.S. National Phase Application under 35 U.S.C. 371 of International Application No. PCT/JP2017/015505 filed on Apr. 17, 2017. This application is based on and claims the benefit of priority from Japanese Patent Application No. 2016-088314 filed on Apr. 26, 2016. The entire disclosures of all of the above applications are incorporated herein by reference.

TECHNICAL FIELD

The present invention relates to a curable polyurethane type resin composition containing polyols and polyisocyanate, and an electrical component which uses the polyurethane type resin composition.

RELATED ART

Polyurethane resins which are obtained by reacting polyisocyanate with polyols are widely used in many types of electrical components. Among the polyurethane resins, those that use castor oil polyol as the raw material are relatively low in cost, universally superior, and have high insulating properties. These polyurethane resins are therefore useful as sealing materials used for electrical components. However, since these polyurethane resins include double bonds which are derived from the polyunsaturated fatty acids in the castor oil, the resins tend to harden when left for long periods in high temperature environmental conditions, and/or the backbone ester bonds undergo hydrolysis in atmospheres which include water causing the resin to soften. For the above reasons, the decrease in physical properties occurring as time passes when polyurethane resins is therefore an issue, especially in high temperature high moisture environments.

There are known techniques that suppress such a decrease in the physical properties, relative to ester hydrolysis, for example, by adding carbodiimide compounds or epoxy compounds to the polyurethane resins, carboxylate or both carboxylate and alcohol which are generated by hydrolysis can be bound, and thus suppress a decrease in the physical properties.

For example, the Patent Literature 1 discloses a method of including co-existing at least one type of compound as a hydrolysis suppressor, among a specific carbodiimide, a piperidine derivative and a piperazinone derivative with an ester.

CITATIONS

Patent Literature 1: 1995-224000-A

However, since almost all of carbodiimide compounds are solids in the form of powder, compatibility with urethane raw material before curing becomes difficult. In order to make carbodiimide compounds compatible with urethane raw material it is necessary to perform heating, however there are concerns of this process not only being complex, but also detrimentally effecting the terminal functional group. In contrast, once the epoxy compounds are added, there is an issue of the cured substance becoming hard and flexibility of the sealing material decreasing.

In environments where low temperatures and high temperatures are repeated particularly with in-vehicle parts, the sealing material may not adjust with the contraction of each component, and therefore cracking or detaching from the component was a concern. In this way, it is considered that sealing materials used in electrical devices mounted in vehicles that have physical properties to meet these particular needs are yet to be obtained.

In view of the above-described issues, the present disclosure aims to provide a curable polyurethane type resin composition which can be used in sealing materials of electrical devices mounted in a vehicle, having improved hydrolysis resistance of a cured substance and can suppress a decrease in physical properties in high-temperature environments. The present disclosure also aims to provide an electrical device which uses the polyurethane type resin composition.

SUMMARY

An aspect of the present invention is a curable polyurethane type resin composition that contains castor oil-type polyol, polyisocyanate and epoxidized acrylic polymer.

Another aspect is an electrical device including an electrical component. The electrical component is covered with a sealing material consisting of the curable polyurethane-type resin composition curing substance.

Effects of Invention

The curable polyurethane type resin composition forms the polyurethane curing substance by the reaction of castor oil-type polyol and polyisocyanate to form urethane bonds. The epoxidized acrylic polymer is contained in the cured substance. The epoxidized acrylic polymer has a function of enhancing the hydrolysis resistance of cured substances. It is considered that epoxy groups suppress the softening of the cured substance caused by hydrolysis since the epoxy groups can react with carbonate or both carbonate and alcohol which are generated through the hydrolysis of ester bonds derived from castor oil-type polyol and thus form new bonds. Since acrylic polymers containing epoxy groups are compatible with castor oil-type polyol and polyisocyanate, the curable polyurethane type resin compositions are easily adjusted.

Additionally, since the cured substance of the curable polyurethane type resin composition will not become excessively hard, such materials may be applied to electrical devices for vehicles.

The sealing material which consists of the cured substance of curable polyurethane type resin composition therefore has superior hydrolysis resistance, can suppress the decrease in physical properties of the sealing material and largely enhance durability of electrical devices in high temperature and high moisture environments.

BRIEF DESCRIPTION OF DRAWING

In the accompanying drawings.

FIRST EMBODIMENT

Figure 1:
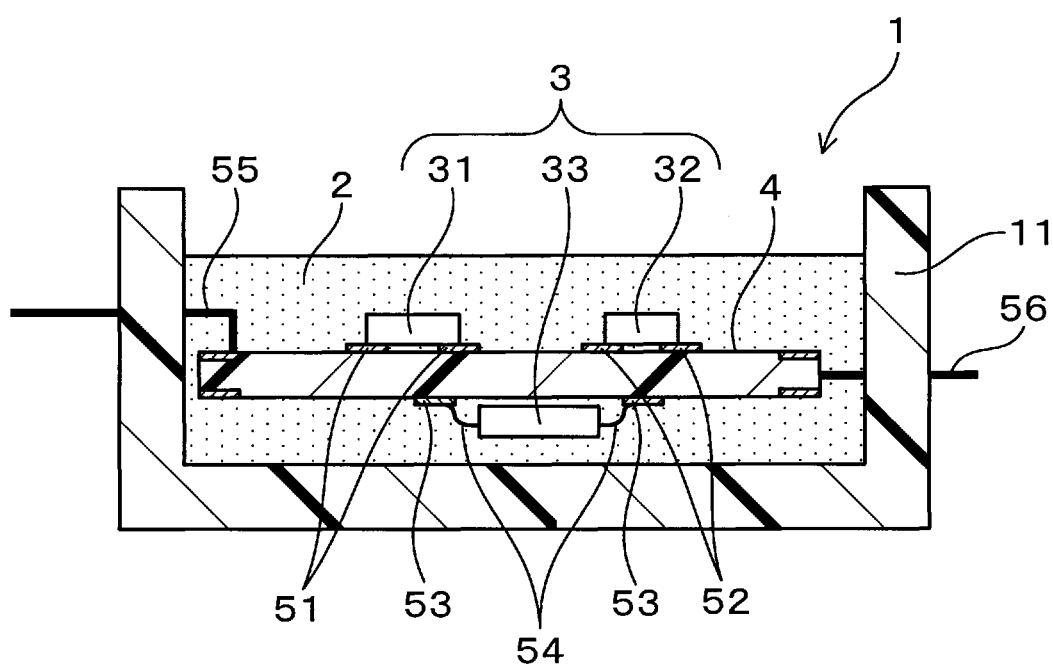
FIG. 1 is an overall cross sectional view showing an electrical device using a curable polyurethane type resin composition as an example of an electrical control unit, according to a first embodiment.

Hereafter, a curable polyurethane type resin composition and an electrical device according to a first embodiment will be described based on the Figs. As shown in an example in FIG. 1, the electrical device 1 is an electrical control unit (that is an ECU), for example, used in a vehicle. The curable polyurethane type resin composition is used as a sealing material 2 for the electrical device 1.

The electrical device 1 includes a resin case 11, a base plate 4 accommodated inside the case 11, and each type of electrical component 3 mounted on the base plate 4. The sealing material 2 is formed from cured substance of the curable polyurethane type resin composition filled inside the case 11 and cured. The electrical components 3 are a plurality of ceramic capacitors 31 and 32 mounted on a surface of the base plate 4 (that is upper surface in the Figs) and an engine control IC chip 33 mounted on a lower surface (that is a lower surface in the Figs) for example.

The base plate 4 is formed of a known print wiring base plate, for example, onto which conductor layers 51 to 53 which are a part of the wiring are formed. The plurality of ceramic capacitors 31 and 32 are connected to respective conductor layers 51 and 52 formed on the surface of the base plate 4 via soldering layers, for example, each of which are omitted from the figs. The IC chip 33 is connected to the conductor layer 53 formed on the rear surface of the base plate 4 via a bonding wire 54. External connection terminals 55 and 56 are provided to extend to an outside through a wall of the case 11, on an outer periphery section of the base plate 4.

The curable polyurethane type resin composition contains castor oil-type polyol (a1), polyisocyanate (a2) and an epoxidized acrylic polymer (B). The curable polyurethane type resin composition is not limited to a mixed substance containing all the above mentioned components, that is, the castor oil polyol (a1), the polyisocyanate (a2) and the epoxidzed acrylic polymer (B).

The curable polyurethane type resin composition is a concept including a composition which includes a prepolymer obtained by reaction of at least one part of castor oil-type polyol (a1) and at least one part of polyisocyanate, and also further includes at least one part among, the castor oil polyol (a1), the polyisocyanate (a2) and the epoxidzed acrylic polymer (B), provided as a separate body.

The at least one part provided as the separate body may be, for example, a composition which contains a mixed substance of the castor oil-type polyol (a1) and the epoxidized acrylic polymer (B), and the polyisocyanate (a2) provided as a separate body from the mixed substance; a composition which contains a mixed substance of the polyisocyanate (a2) and the epoxidized acrylic polymer (B), and the castor polyol (a1) provided as a separate substance from the mixed substance; a composition which includes a mixed substance of the castor oil-type polyol (a1) and the polyisocyanate (a2), and the epoxidized acrylic polymer (B) provided as a separate body from the mixed substance; or the at least one part may also be a composition which contains the castor oil-type polyol (a1), the polyisocyanate (a2) and the epoxidzed acrylic polymer (B) each of which are provided as separate substances.

Specifically, the curable polyurethane type resin composition may have a main agent that includes the castor oil-type polyol (a1) and a curing agent that includes the polyisocyanate (a2). In the case of a two component mixed type, the curing agent is mixed with the main agent at the point of curing.

The composition may also be a one component moisture curing type which reacts with water in the atmosphere. In the case of the two component mixed type, the main agent includes the castor oil-type polyol (a1) and the epoxidized acrylic polymer. A composition may include any one of a composition including polyisocyanate (a2) as the curing agent, a composition including the castor oil-type polyol as the main agent, or a composition including polyisocyanate (a2) as the curing agent and acrylic polymer including the epoxy group. In the case of the one component moisture curing type, a curable polyurethane type resin composition is obtained by the reaction of a hydroxyl group of the castor oil-type polyol (a1) and the polyisocyanate (a2), and by adding the epoxidized acrylic polymer (B) to the urethane polymer that has isocyanate group on the end terminal.

In the case of the two component mixed type, the curable polyurethane type resin composition is cured by the reaction of castor oil polyol (a1) and polyisocyanate (a2) to bind urethane and form a cured substance. Furthermore, in the case of one component mixed type, the urethane polymer includes urethane bonds by reaction of the castor oil-type polyol (a1) and polyisocyanate (a2) and the end terminal isocyanate group, this end terminal isocyanate group reacts with water and curing occurs, thus forming the cured substance. That is, the cured substance contains polyurethane (A) which consists of structural units derived from castor oil-type polyol (a1) and structural units derived from polyisocyanate, and epoxidized acrylic polymer (B).

At this point, the epoxidized acrylic polymer (B) enhances hydrolysis resistance of the polyurethane (A) and has a function of suppressing physical deterioration of cured substances.

For the generation of polyurethane (A), a castor oil or a castor oil derivative can be used as the castor oil-type polyol (a1). The castor oil is an ester of fatty acid and glycerol with ricinoleic acid as the main component. The castor oil includes hydroxyl groups and double bonds derived from the ricinoleic acid.

The castor oil derivative is a substance which has undergone transesterification with a castor oil partial dehydrate concentrated substance, a castor oil and a low molecular polyol, a polyether polyol or a polyester polyol, for example. The castor oil derivative may also be hydrogenated additive of the abovementioned compounds. The castor oil may also be a low molecular polymer of a castor oil derivative. The castor oil polyol (a1) may include 1 type or two or more types of components selected from these castor oils or castor oil derivatives.

The castor oil polyol (a1) which is used has a number of functional groups (specifically hydroxyl groups) in a range of 1 to 8 and preferably in a range of 2 to 6, a hydroxyl group value in a range of 10 to 500 and preferably in a range of 50 to 200, and an acid value of 10 or less and preferably 5 or less, for example.

If the number of functional groups is less than 1, there is a concern that the cured substance will have a low cross-linking density, and also the heat resistance and/or the heat-moisture resistance will also decrease. In contrast, if the number of functional groups is more than 8, the cross-linking density increases and the cured substance easily becomes brittle. Additionally, if the hydroxyl value is less than 10, the cured substance has decreased cross-linking density and a cured substance with deteriorated heat resistance and heat-moisture resistance. Furthermore, if the hydroxyl value is greater than 500, the cross-linking density increases and there is a concern of the cured substance easily becoming brittle.

Additionally, if the acidic value is greater than 10, the speed of the deterioration of durability may increase due to the acidity. In this way, a commercial castor oil polyol (a1) is [URIC H-30, H-62, H-1824] and POLYCASTOR #10 manufactured by ITOH Oil, for example, may be used.

The polyurethane (A) is obtained by adding a polyisocyanate (a2) curing agent to the main agent castor oil polyol (a1), and thermal curing thereof. The polyisocyanate (a2) is not particularly limited, and any type of polyisocyanate used to produce a regular polyurethane may be used. That is, aliphatic isocyanates, such as hexamethylene diisocyanate (specifically HDI), and isophorone diisocyanate (specifically IPDI), aromatic polyisocyanates, such as 2,4 or 2,6-toluene diisocyanate (specifically TDI), and 2,2'-, 2,4' or 4,4'-diphenyl methane diisocyanate (specifically MDI), and a dimer formed by modification of the above mentioned carbodiimides, for example, and a modified isocyanate for example of a trimer formed by an isocyanurate ring, for example, may be used.

Among the above described, a dimer or a trimer aromatic polyisocyanate are preferable due to having high coherence force, and thus superior heat resistance and heat-moisture resistance. The polyisocyanate (a2) may be one type of the above mentioned may be used alone, or two kinds of the above mentioned compounds may be used in combination.

For example, SBU0632 manufactured by Covestro, may be used as the curing agent polyisocyanate (a2) to generate polyurethane (A).

The castor oil polyol (a1) and the polyisocyanate (a2) are combined to have a relationship of a general main agent and the curing agent respectively. Specifically, an equivalent ratio of the functional groups of both the castor oil polyol (a1) and the poly isocyanate (a2) (specifically, the equivalent ratio of the hydroxyl group: isocyanate group) that is the adjusted to be in a range of 0.5 to 1.5, for example, preferably in a range of 0.8 to 1.2, and more preferably in a range of 0.9 to 1.1.

It is noted that a structural units that are derived from castor oil-type polyol (a1) and a component other than the structural units derived of polyisocyanate (a2) may be contained in the structure of polyurethane. That is, polyols other than the main agent castor oil polyol (a1), for example, acrylic-type polyol, polyether polyol, polyester polyol, and polycarbonate polyol, may be used in a range in which the curable polyurethane type resin composition is adjustable to a desired viscosity. In this case, an added quantity of the other polyols is 50 weight parts or less, and preferably 30 weight parts or less, for example, in relation to 100 mass parts of the castor oil-type polyol (a1). Other added agents, for example, reversible agents, adhesion promoter, and oxidation prevention agents, used in the manufacture of polyurethane may also be used.

In addition to the castor oil-type polyol (a1) and the polyisocyanate (a2), the epoxidzed acrylic polymer (B) also comprise the curable polyurethane type resin composition. The epoxidized acrylic polymer (B) include an acrylic polymer backbone, and are acrylic type polymers having epoxy groups on side chains for example. The epoxidized acrylic polymer (B) enhances the hydrolysis resistance of the cured substances. The epoxy groups of the epoxidized acrylic polymer (B) are reactive with either one of carbonate having carboxyl groups and alcohol having hydroxyl groups that are produced by the hydrolysis of castor oil polyol. The epoxidized acrylic polymer (B) preferably has 2 or more epoxy groups in one molecule. In this case, the epoxidized acrylic polymer (B) can form new bonds by reacting with the carboxyl groups produced by hydrolysis, or by reacting with each of the carboxyl groups and the hydroxyl groups produced by hydrolysis. Additionally, the acrylic polymer containing epoxy group (B) preferably will not include double bonds. In this case, stability of the structure is further increased and the heat resistance may be enhanced.

The epoxidized acrylic polymer (B) preferably has an average molecular weight of 10000 or less. In providing the epoxidzed acrylic polymer (B) with an average molecular weight of 10000 or less, the formation of the acrylic polymers may form a solution state or fluid state, and compatibility, casting properties and workability of the epoxidized acrylic polymer are enhanced. The average molecular weight of the epoxidized acrylic polymer (B) is 8000 or less and preferably 4000 or less.

The lower the average molecular weight is the lower the viscosity, and the compatibility of the epoxidized acrylic polymer (B) with other components is thus increased, and the casting properties are enhanced.

The epoxidized acrylic polymer (B) has an epoxy group content preferably in a range of 0.5 milliequivalents/g to 1.7 milliequivalents/g. If the epoxy group content is 0.5 milliequivalents/g or higher, suppression effects of softening of the cured substance, caused by hydrolysis is increased. When the content of the epoxy group is increased, although the suppression effects of softening of the cured substance is enhanced, there is an issue that the cured substance may harden with age, and thus flexibility may also decrease, therefore in providing the epoxy content preferably 1.7 milliequivalents/g or less, flexibility of cured substance is maintainable.

An acrylic type monomer configuring the polymer backbone is specifically (meth) acrylic acid, (meth) acrylic acid ester, and a monomer containing at least one type of acrylic acid and/or acrylic acid ester derivative. In the specification, (meth) acrylic acid defines either acrylic acid or methacrylic acid, and (meth) acrylic acid ester defines acrylic acid or methacrylic acid ester. The epoxidized acrylic polymer (B) is obtained by introducing the epoxy groups into a part of these acrylic type monomers or copolymers. That is, by using the (meth) acrylic acid ester containing epoxy groups as a part of the acrylic type monomer, for example, an acrylic type polymer containing epoxy group on a side chain is obtained.

The epoxidized acrylic polymer (B) has a viscosity of 5000 mPa·s or less at 25° C., for example, and a glass transposition point (that is Tg) which has a temperature lower than room temperature, for example, is used. In this way, UG4000 and UG4010, manufactured by TOAGOSEI CO., LTD, for example, can be used as a commercial epoxidized acrylic polymer (B).

The curable polyurethane type resin composition is obtained by combining, at predetermined percentages, the castor type polyol (a1) which is polyurethane (A), for example, and polyisocyanate (a2), and further combining the acrylic polymer (B) containing epoxy groups (B), and by then equally mixing all above-mentioned components together. At this point, the cured substance obtained by thermal curing of the curable polyurethane type components is the structural units derived from castor oil-type polyol (a1) and polyurethane (A) having a cross linking structure including structural units derived from the polyisocyanate (a2), and epoxidized acrylic polymer which is equally mixed with the above substances.

As described hereinabove, the two component mixed type may be obtained by preparation of the castor oil-type polyol (a1) as the main agent, and the polyisocyanate (a2) as the curing agent to form a predetermined ratio, and by then combining the epoxidized acrylic polymer (B) to either one of the oil-type polyol (a1) and the polyisocyanate (a2) at a predetermined percentage. Furthermore, by uniformly mixing the main agent and the curing agent of the two mixed-type component and thermal curing thereof, a cured substance of the curable polyurethane type resin composition is obtained.

Additionally, the component may be a one moisture curing-type component formed by the pre-reaction of the castor oil-type polyol (a1) and the polyisocyanate (a2) to generate a urethane prepolymer, and then adding the epoxidized acrylic polymer (B) at a predetermined percentage. Also, by curing of the one component moisture curing-type in atmospheric conditions that contains water, the cured substance of the curable polyurethane type resin composition is obtained.

Figure 2:
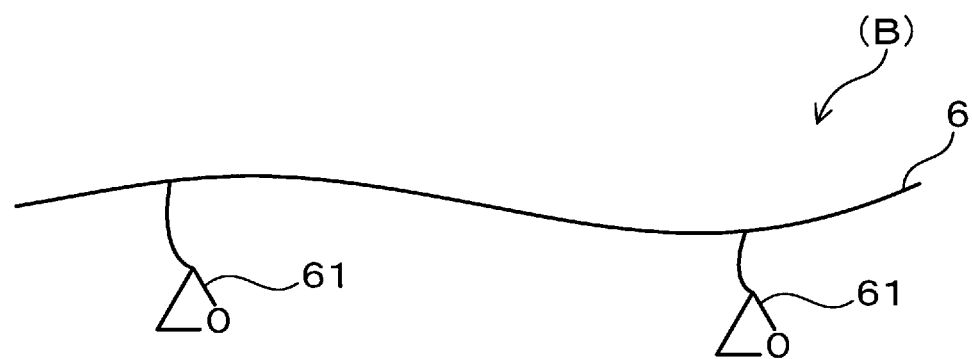
FIG. 2 schematically shows an example of a structure of acrylic polymers containing epoxy groups comprising a curable polyurethane type resin composition.

Since the polyurethane (A) includes hydrolyzing ester bonds in the structure, the polyurethane is degraded to carboxylate and alcohol (specifically, carboxyl groups derived from fatty acids of castor oil-type polyol (a1) and hydroxyl groups derived from glycerin) in the presence of water. In contrast, as schematically shown in the structure example of FIG. 2, the epoxidized acrylic polymer (B) has 2 side chains 61 which extend from the acrylic polymer backbone 6.

The two side chains 61 each have a structure that includes an epoxy group on the end terminal. In the cured substance, these epoxy groups are reactive with carboxyl groups or hydroxyl groups generated by hydrolysis of ester bonds. It is considered that these epoxy groups when closely positioned can therefore react with the generated carboxyl groups or both the carboxyl groups and hydroxyl groups, in positions where the ester bonds are broken, and thus form new bonds in which the epoxidized acrylic polymer (B) is intervened.

Accordingly, the softening of the cured substance due to hydrolysis is suppressed, and deterioration of physical properties over a time period is also effectively suppressed.

The epoxidized acrylic polymer (B) is preferably added to be 10 mass parts to 80 mass parts, relative to a 100 mass parts of castor oil-type polyol (a1) in the polyurethane. If the epoxidized acrylic polymer (B) preferably exists at 10 mass parts or more, relative to the castor oil-type polyol (a1), the epoxy groups closely positioned to the ester bonds are reacted when the ester bonds are hydrolyzed, and sufficient suppression of the softening of the cured substance is thus obtained.

When the combined ratio of the epoxidized acrylic polymer (B) is increased, the percentage of the epoxy groups having reactivity is also increased relative to the hydrolysis of the ester bonds, and the suppression effect of the softening of the cured substance is further enhanced. However, if the content of the epoxidzed acrylic polymer (B) is excessively high, then the hardening of the cured substance may decrease. Therefore the content of the epoxidized acrylic polymer (B) is preferably 80 mass parts or less.

As described hereinabove, since the content of the epoxy groups in the epoxidized acrylic polymer (B) is preferably selected from the range of 0.5 milliequivalents/g to 1.7 milliequivalents/g, when a combined quantity of the epoxy groups (epoxidized acrylic polymer (B)) is in a range of 10 to 80 mass parts, relative to 100 mass parts of the of the castor oil-type polyol (a1), the epoxy group content of the epoxidized acrylic polymer (B) may be provided in a range between 5 milliequivalents/(that is, 0.5 milliequivalents/g; 10 mass parts) to 136 milliequivalents/(that is, 1.7 milliequivalents; 80 mass parts) for 100 mass parts of the castor oil-type polyol (a1).

It is noted that since the percentage of the epoxy groups having reactivity is changed also by the content of epoxy groups in the epoxidzed acrylic polymer (B), if the content of the epoxy groups is relatively low, the epoxidzed acrylic polymer (B) may be high, relative to the ester bonds derived from the castor oil-type polyol (a1) of the polyurethane (A). The ratio of the epoxy groups relative to the castor oil-type polyol (a1) is thus increased and the suppression effects of softening of cured substance may also be increased. Also, if the content of the epoxy groups is relatively high, then the content of the epoxidzed acrylic polymer (B) may also be low. Furthermore, an increase of the combined ratio of the epoxidized acrylic polymer (B) relative to the polyurethane (A) is suppressed and a decrease in hardness of the cured substance may be suppressed. For example, the content epoxy groups in the epoxidized acrylic polymer (B) is preferably 10 to 60 milliequivalents per 100 mass parts of castor oil-type polyol (a1), for example.

In the case of the sealing material 2 of the electrical device 1, for the adjustment of the two mixed-type curable polyurethane type resin composition, for example, the castor oil-type polyol (a1) and the polyisocyanate (a2) as raw materials of the polyurethane, and acrylic polymers containing epoxy groups (B) are used. The above mentioned are mixed together, injected inside the case 11 filled such that the base plate 4 and the electrical components 3 are covered, and the sealing material 2 is thus obtained by thermal curing. The sealing material consists of the cured substance.

Since the epoxidized acrylic polymer (B) having desirable compatibility is uniformly mixed in the raw material of polyurethane (A), the curable polyurethane type resin composition has superior casting features, and thus the plate base 4 and electrical components 3 may be entirely covered. Also, since the epoxidzed acrylic polymer (B) is uniformly dispersed in the cured substance which is obtained, even in a case of the ester bonds derived from the castor oil-type polyol (a1) of the polyurethane (A) undergoing hydrolysis, re-bonding of the ester bonds is achievable by the surrounding acrylic polymers containing epoxy groups (B), and cross-linking structure is strengthened thus softening of the cured substance may be suppressed.

A curable polyurethane type resin composition having casting features with a low viscosity and desirable workability may be obtained with the castor oil-type polyol (a1) as the main agent. Additionally, a cured substance that has superior hydrolysis resistance even in high temperature high moisture environments, and high insulating properties may be obtained. The viscosity of the curable polyurethane type resin composition is preferably 2000 mPa·s or less at 25° C., for example, and the hardness of the cured substance is preferably in a range of 20 to 60 when measured by the ASKER Durometer Type C.

Example 1

As described hereafter, the curable polyurethane type resin composition was adjusted and the cured substance which was set was thus formed. Under either high temperature or high temperature and high moisture conditions a heat resistance test of the obtained cured substance was performed, and after the test, changes in the physical properties of the cured substance were investigated.

Firstly, a commercial castor oil polyol (a1-1) as the castor oil-type polyol (a1) and a commercial modified MDI (a2-1)

as the polyisocyanate (a2) were prepared as the polyurethane (A) raw materials. URIC H1824 (that is functional group no: 2.3, hydroxyl group value: 66, acid value: 4.0 or less) manufactured by ITOH OIL was used as the castor oil polyol (a1-1). SBU0632 manufactured by Covestro Japan was used as the modified MDI (a2-1). A commercial epoxidized acrylic polymer (B-1) was prepared as the epoxidzed acrylic polymer (B). A UG4010 manufactured by TOAGOSEI CO., LTD (specifically, having an average molecular weight: 2900, an epoxy group content: 1.4 milliequivalents/g, viscosity 3700 Pa·s at 25° C., Tg: −57° C.) was used as the epoxidized acrylic polymer (B-1).

Also, 10 mass parts of the epoxidized acrylic polymer B1 and an equivalent ratio of the modified MDI (a2-1), relative to 100 mass parts of the castor oil polyol (a1-1), were each measured and added, and by sufficient mixing of the entire contents the curable polyurethane type resin composition was obtained.

Next, the curable polyurethane type resin composition, was dipped into an aluminum cup, and by curing in a curing oven adjusted to 130° C. for 1 hour, the cured substance was obtained. The aluminum cup had a diameter of approximately 40 mm and height of approximately 10 mm. The viscosity and the hardness of the cured substance was measured and evaluated of which is shown in FIG. 1.

A B shaped viscometer was used to measure the viscosity. The viscosity at 25° C., which was 2000 mPa·s or less was determined as good, and viscosity which exceeded 2000 mPa·s was determined as poor. Additionally, in order to measure the hardness, the ASKER Durometer Type C was used. A hardness in a range of 20 to 60 was determined as good, and a hardness in a range other than 20 to 60 was determined as poor.

Additionally, the obtained cured substance was subjected to a pressure cooker test, thereafter the hardness of the cured substance was measured. The pressure cooker test was performed by placing the cured substance in a testing chamber, and maintained at 121° C., 2 atmospheric pressures, and humidity 100% humidified atmosphere for 72 hours. The obtained cured substance was then subjected to a high temperature durability test by maintaining at 120° C. for 1000 hr, after which the hardness of the cured substance was then measured. After each test, the hardness of the cured substance was measured using the ASKER Durometer Type C. A hardness which was determined to be in a range of 20 to 60 was determined as good, and a hardness measuring out of this range was determined as poor.

As shown in the results in Table 1, an initial viscosity and an initial hardness of the cured substance of the first example were both determined as good. A hardness of the cured substance was also good after the high temperature high durability test, that is, the pressure cooker test.

Example 2 to Example 5

A curable polyurethane type resin composition (that is, example 2) was obtained by using the same method of example 1 with the exception of adding 30 mass parts of the epoxidized acrylic polymer (B1), relative to a 100 mass parts of the castor oil polyol (a1-1).

A curable polyurethane type resin composition was also obtained (that is, example 3) by using the same method of example 1, with the exception of using 80 mass parts of a commercial epoxidized acrylic polymer (B-2) as the epoxidized acrylic polymer (B). UG4000 (that is, an average molecular weight of 3000, an epoxy content: 0.7 milliequivalents/g, a viscosity: 3000 mPa·s at 25° C., Tg: −61° C.) manufactured by TOAGOSEI CO., LTD, was used as the epoxidized acrylic polymer (B-2).

TABLE 1

| | | EXAMPLES AND COMPARATIVE EXAMPLES | | | | | | |
|---|---|---|---|---|---|---|---|---|
| | | EXAMPLES | | | | | COMPARATIVE EXAMPLES | |
| | | 1 | 2 | 3 | 4 | 5 | 1 | 2 |
| CONSTITUENTS (MASS PARTS) | CASTOR OIL POLYOL (a1-1) | 100 | 100 | 100 | — | 50 | 100 | 100 |
| | CASTOR OIL POLYOL (a1-2) | — | — | — | 100 | 50 | — | — |
| | EPOXIDIZED ACRYLIC POLYMER (B-1) | 10 | 30 | — | — | — | — | — |
| | EPOXIDIZED ACRYLIC POLYMER (B-2) | — | — | 80 | 80 | 80 | — | — |
| | BISPHENOL A EPOXY RESIN | — | — | — | — | — | 30 | — |
| | MODIFIED MDI (a2-1) | Eq RATIO | Eq RATIO | Eq RATIO | Eq RATIO | Eq RATIO | Eq RATIO | Eq RATIO |
| | EPOXY GROUP CONTENT (mEq/g) *1 | 1.4 | 1.4 | 0.7 | 0.7 | 0.7 | — | — |
| | EPOXY GROUP CONTENT (mEq/g/100 MASS PARTS)*2 | 14 | 42 | 56 | 56 | 56 | — | — |
| INITIAL PHYSICAL PROPERTIES | VISCOSITY (mPa · s) | 1200 | 1300 | 1800 | 1900 | 1840 | 1100 | 1100 |
| | DETERMINATION*3 | GOOD | GOOD | GOOD | GOOD | GOOD | GOOD | GOOD |
| | HARDNESS(ASKA DUROMETER TYPE (C) | 40 | 34 | 27 | 52 | 40 | 30 | 42 |
| | DETERMINATION*4 | GOOD | GOOD | GOOD | GOOD | GOOD | GOOD | GOOD |
| AFTER DURABILITY | HARDNESS (AFTER 72 hr PRESSURE COOKER TEST) | 25 | 28 | 21 | 43 | 33 | 80 | N/M |
| | DETERMINATION*4 | GOOD | GOOD | GOOD | GOOD | GOOD | POOR | POOR |
| | HARDNESS (AFTER 1000 hr AT 120° C. | 60 | 50 | 35 | 58 | 47 | 100 | 100 |
| | DETERMINATION*4 | GOOD | GOOD | GOOD | GOOD | GOOD | POOR | POOR |

*1 Epoxy content per unit mass weight in acrylic polymer containing epoxy groups (B-1, B-2)
*2Epoxy content per 100 mass parts of castor oil polyol (a1-1, a1-2)
*3GOOD: ≤2000 (mPa · s)
*4GOOD: 20 to 60, POOR: less than 20 or over 60
N/M: not measurable A curable polyurethane type resin composition (specifically, example 4) was also obtained by employing the same method described in the example 1 with the exception of using a 100 mass parts of a commercial castor oil polyol (a1-2) as the castor oil-type polyol, 80 mass parts of the epoxidized acrylic polymer (B-2) relative to the 100 mass parts of the commercial castor oil polyol (a1-2). The POLYCASTOR #10 manufactured by ITOH Oil (that is, number of functional groups 5 to 6, hydroxyl group value of 155 to 165, acid value: 40 or less) was used as the castor oil polyol. A curable polyurethane type resin composition (specifically, example 5) was also obtained by employing the same method described in the example 1 with the exception of using 50 mass parts of castor oil polyol (a1-1) and 50 mass parts of castor oil polyol (a1-2), that is a total of 100 mass parts, as the castor oil-type polyol (a1), and 80 mass parts of the epoxidized acrylic polymer (B-2), relative to the castor oil polyol.

The initial physical properties of the curable polyurethane type resin compositions according to examples 2 to 5 were measured using the same method described in the example 1. The pressure cooker test and the heat resistance durability test were each measured in the same manner as example 1. The test results and the evaluation are both shown together in Table 1.

As shown in Table 1, the initial viscosity and the initial hardness of the cured substances in the example 1 to example 5 were determined to be good, and the hardness after the high temperature durability test, that is, the pressure cooker test was also good.

Comparative Example 1 and Comparative Example 2

A curable polyurethane type resin composition (specifically comparative example 1) was obtained using the same method as the example 1 with the exception of the epoxidized acrylic polymer (B) which was substituted with 30 mass parts of a commercial Bisphenol-A epoxy resin (that is, D.E.R™331J manufactured by Dow Chemical), relative to a 100 mass parts of the castor oil-type polyol (a1-1).

A curable polyurethane type resin composition (specifically, comparative example 2) was obtained. The comparative example 2 had only an equivalent ratio of modified MDI (a1-1), relative to a 100 mass parts of the castor oil polyol (a1-1) combined without having the epoxidized acrylic polymer (B) contained.

The initial physical properties of the curable polyurethane type resin compositions of the respective comparative examples 1 and 2 were measured in the same manner as the example 1. The hardness of the cured substance was determined after the pressure cooker test and the heat resistance durability test were each performed in the same manner as example 1. The results and the evaluation of the test are shown together in Table 1.

As shown in the results in Table 1, although the initial viscosity and the initial hardness of the cured substance for the comparative example 1 was good, the hardness after the pressure cooking test and high temperature resistance test increased to 80 and 100 respectively. Also, for the comparative example 2, although the initial viscosity of the cured substance was good, the hardness of the cured substance increased to 100 after the high temperature resistance test, and measurement of the hardness after the pressure cooker test was not achieved.

As described hereinabove, it was found that in combining the epoxidized acrylic polymer (B) with the castor oil-type polyol (a1) and the polyisocyanate (a2), the suppression effects of softening of the cured substance were obtained.

The present disclosure is not limited to the embodiments described hereinabove and may be used for a variety of purposes. For example, the embodiments hereinabove describe a cured substance of a curable polyurethane resin component used as a sealing material for an in-vehicle ECU, however the electrical devices are not limited to vehicle parts. That is, the sealing material may be used to cover other electrical devices and each type of ECU or each type of semiconductor device other than ECUs.

What is claimed is:

1. An electrical device comprising:
   electrical components and a sealing material, wherein the electrical device has the electrical components covered with the sealing material consisting of a curable polyurethane-type resin composition containing castor oil-type polyol, polyisocyanate, and epoxidized acrylic polymer having a content of 10 mass parts to 80 mass parts, relative to a 100 mass parts of the castor oil-type polyol.

2. The electrical device according to claim 1, wherein the epoxidized acrylic polymer has an average molecular weight of 10000 or less.

3. The electrical device according to claim 1, wherein the epoxidized acrylic polymer has a content of epoxy groups, per unit mass part, of 0.5 milliequivalent per g to 1.7 milliequivalent per g.

4. The electrical device according to claim 2, wherein the epoxidized acrylic polymer has a content of epoxy groups, per unit mass part, of 0.5 milliequivalent per g to 1.7 milliequivalent per g.

5. An electrical device comprising:
   electrical components and a sealing material, wherein the electrical device has the electrical components covered with the sealing material consisting of a curable polyurethane-type resin composition containing castor oil-type polyol, polyisocyanate, and epoxidized acrylic polymer, and wherein the epoxidized acrylic polymer has a content of epoxy groups, per unit mass part, of 5 milliequivalent to 136 milliequivalent per 100 mass parts of the castor oil-type polyol.

6. The electrical device according to claim 5, wherein the epoxidized acrylic polymer has an average molecular weight of 10000 or less.

7. The electrical device according to claim 4, wherein the epoxidized acrylic polymer has a content of epoxy groups, per unit mass part, of 5 milliequivalent to 136 milliequivalent per 100 mass parts of the castor oil-type polyol.

8. The electrical device according to claim 3, wherein the epoxidized acrylic polymer has an average molecular weight of 10000 or less.

9. The electrical device according to claim 1, wherein the epoxidized acrylic polymer has a content of epoxy groups, per unit mass part, of 5 milliequivalent to 136 milliequivalent per 100 mass parts of the castor oil-type polyol.

10. The electrical device according to claim 8, wherein the epoxidized acrylic polymer has a content of epoxy groups, per unit mass part, of 5 milliequivalent to 136 milliequivalent per 100 mass parts of the castor oil-type polyol.

11. The electrical device according to claim 9, wherein the epoxidized acrylic polymer has an average molecular weight of 10000 or less.

* * * * *